United States Patent
Shin et al.

(10) Patent No.: US 9,916,888 B1
(45) Date of Patent: Mar. 13, 2018

(54) SYSTEM FOR MEASURING ACCESS TIME OF MEMORY

(71) Applicant: Dongbu HiTek Co., Ltd., Bucheon-si (KR)

(72) Inventors: Woo Cheol Shin, Suwon-si (KR); Kyung Il Baek, Gimpo-si (KR); Hyun Sup Jung, Incheon (KR)

(73) Assignee: Dongbu HiTek Co., Ltd., Bucheon-si (KR)

( * ) Notice: Subject to any disclaimer, the term of this patent is extended or adjusted under 35 U.S.C. 154(b) by 0 days.

(21) Appl. No.: 15/622,566

(22) Filed: Jun. 14, 2017

(30) Foreign Application Priority Data

Nov. 23, 2016 (KR) ........................ 10-2016-0156558

(51) Int. Cl.
*G11C 11/41* (2006.01)
*G11C 11/413* (2006.01)
*G11C 29/50* (2006.01)
*G11C 29/04* (2006.01)
*G11C 8/18* (2006.01)
*G11C 7/22* (2006.01)

(52) U.S. Cl.
CPC ...... *G11C 11/413* (2013.01); *G11C 29/50012* (2013.01); *G11C 7/222* (2013.01); *G11C 8/18* (2013.01); *G11C 2029/0401* (2013.01)

(58) Field of Classification Search
CPC ......... G11C 11/413; G11C 7/222; G11C 8/18; G11C 11/1693; G11C 13/0061; G11C 16/32; G11C 29/50012; G11C 2029/0401
USPC .... 365/154, 194, 201, 233.1, 233.11, 233.12
See application file for complete search history.

(56) References Cited

U.S. PATENT DOCUMENTS

| | | | | |
|---|---|---|---|---|
| 6,229,363 B1* | 5/2001 | Eto | ........................... | G06F 1/10 327/158 |
| 2007/0234133 A1* | 10/2007 | Choo | ..................... | G11C 7/222 714/700 |
| 2008/0062809 A1* | 3/2008 | Lee | .......................... | G11C 7/22 365/233.1 |
| 2008/0080263 A1* | 4/2008 | Kim | ..................... | G11C 7/1066 365/189.05 |
| 2015/0256187 A1* | 9/2015 | Hwang | ................. | H03L 7/0802 365/194 |

* cited by examiner

*Primary Examiner* — Tan T. Nguyen
(74) *Attorney, Agent, or Firm* — Andrew D. Fortney; Central California IP Group, P.C.

(57) ABSTRACT

A system for measuring an access time of a memory includes a first delay unit configured to delay a clock signal by a first delay time and to output a first delayed clock signal, a second delay unit configured to delay the clock signal by a second delay time greater than the first delay time and to output a second delayed clock signal, a memory configured to store data, the data being read from the memory in response to the first delayed clock signal, a detection data storage configured to store the data read from the memory in response to the second delayed clock signal, and a controller configured to measure an access time of the memory based on a comparison of the data in the detection data storage and the data in the memory, the first delayed clock signal and the second delayed clock signal.

20 Claims, 9 Drawing Sheets

SYSTEM FOR MEASURING ACCESS TIME OF MEMORY

This application claims the benefit of Korean Patent Application No. 10-2016-0156558, filed on Nov. 23, 2016, which is hereby incorporated by reference as if fully set forth herein.

BACKGROUND OF THE INVENTION

Field of the Invention

Embodiments relate to a system for measuring an access time of an embedded memory.

Discussion of the Related Art

An embedded static random access memory (SRAM) is a device that can write or read data in or from a system on chip (SoC) logic circuit. As miniaturization of semiconductor manufacturing processes has increased, and SOC functionality has become more complex, the frequency of use and the capacity of embedded SRAMs have increased.

The access time of the SRAM during operation is an important index, indicating the read speed of the SRAM. With process miniaturization, accurately measuring timing parameters such as access time on silicon has gradually become complicated and difficult, but the importance thereof has continually increased.

For accurate timing measurement, a circuit specially designed for timing measurement in addition to a logic circuit may be used. However, the circuit designed for timing measurement in one specific manufacturing process should be corrected in order to be used in a different manufacturing process.

SUMMARY OF THE INVENTION

Accordingly, embodiments of the invention are directed to a system for measuring an access time of a memory, which is capable of easily, rapidly and accurately measuring the access time of the memory while eliminating human error and errors generated during testing (e.g., in a test device).

Additional advantages, objects, and features of the invention will be set forth in part in the description which follows and in part will become apparent to those skilled in the art upon examination of the following or as may be learned from practice of the invention. The objectives and other advantages of the invention may be realized and attained by the structure(s) particularly pointed out in the written description and claims hereof as well as the appended drawings.

To achieve these objects and other advantages and in accordance with the purpose(s) of the embodiments, as embodied and broadly described herein, a system for measuring an access time of a memory includes a first delay unit configured to delay a clock signal by a first delay time and to output a first delayed clock signal, a second delay unit configured to delay the clock signal by a second delay time greater than the first delay time and to output a second delayed clock signal, the memory (which is configured to store data), the data being read from the memory in response to the first delayed clock signal, a detection data storage configured to store the data read from the memory in response to the second delayed clock signal, and a controller configured to measure the access time of the memory based on a comparison of the data in the detection data storage and the data in the memory, the first delayed clock signal and the second delayed clock signal.

The controller may adjust the second delay time of the second delay unit when the data in the detection data storage and the data in the memory are equal.

The controller may detect or determine that a difference between the adjusted second delay time and the first delay time as the access time of the memory when the data in the detection data storage and the data in the memory are not equal.

The first delay unit may include a first delay adjuster configured to delay the clock signal (e.g., by a first amount) and a second delay adjuster configured to delay the clock signal delayed by the first delay adjuster (e.g., by a second amount) and to output the first delayed clock signal. The first delay adjuster may adjust the delay time (e.g., of the clock signal delayed by the first delay adjuster) by a multiple of a first reference time, and the second delay adjuster may adjust the delay time (e.g., of the first delayed clock signal) by a sum of a multiple of a second reference time and a multiple of a third reference time.

The second delay unit may include a third delay adjuster configured to delay the clock signal (e.g., by a third amount) and a fourth delay adjuster configured to delay the clock signal delayed by the third delay adjuster (e.g., by a fourth amount) and to output the second delayed clock signal. The third delay adjuster may adjust the delay time (e.g., of the clock signal delayed by the third delay adjuster) by the multiple of the first reference time, and the fourth delay adjuster may adjust the delay time (e.g., of the second delayed clock signal) by the sum of the multiple of the second reference time and the multiple of the third reference time.

Each of the first delay adjuster and the third delay adjuster may include first to n-th (n being a natural number greater than 1) first unit delay blocks. Each of the second delay adjuster and the fourth delay adjuster may include a plurality of second unit delay blocks connected in series. The delay time of each of the first unit delay blocks may be the first reference time, and the delay time of each of the second unit delay blocks may be the second reference time or the third reference time.

Each of the first unit delay blocks may include an inverter and an inversion output multiplexer including a first input terminal, a second input terminal and an output terminal. The inversion output multiplexer may be configured to select one of a signal input to the first input terminal and a signal input to the second input terminal based on a first selection signal and to output a selected inverted signal. The output terminal of the inverter may be connected to the first input terminal of the inversion output multiplexer, and the output terminal of the inversion output multiplexer of a k-th (k being a natural number satisfying 1<k≤n) first unit delay block may be connected to the second input terminal of the inversion output multiplexer of a (k−1)-th (k being a natural number satisfying 1<k≤n) first unit delay block.

Each of the second unit delay blocks may include a first logic gate configured to perform a logic operation on the clock signal delayed by the first delay adjuster and a selection control signal, a second logic gate configured to perform a logic operation on the clock signal delayed by the first delay adjuster and an inverted selection control signal, and a path selector configured to output one of an output of the first logic gate and an output of the second logic gate based on a second selection signal. The first logic gate and the second logic gate may each comprise an AND gate, and may have different slew rates.

The first delay unit may include a first selector configured to select and output one of the clock signal and the first delayed clock signal, a first inverter configured to invert the first delayed clock signal, a second selector configured to select and output one of the clock signal and the output of the first inverter to the first delay adjuster, and a first AND gate configured to perform an AND operation on the output of the first inverter and a count enable signal, and to output a first signal.

The second delay unit may include a third selector configured to select and output one of the clock signal and the second delayed clock signal, a second inverter configured to invert the second delayed clock signal, a fourth selector configured to select and output one of the clock signal and the output of the second inverter to the third delay adjuster, and a second AND gate configured to perform an AND operation on the output of the second inverter and a count enable signal, and to output a second signal.

Each of the second unit delay blocks may include a buffer configured to buffer the clock signal delayed by the first delay adjuster, a third inverter configured to invert one of a plurality of second selection signals, a first logic gate configured to perform a logic operation on an output of the buffer and an output of the third inverter, a second logic gate configured to perform a logic operation on the output of the buffer and one of the second selection signals, and a third logic gate configured to perform an OR operation on the output of the first logic gate and the output of the second logic gate. The output of the first logic gate and the output of the second logic gate may have different slew rates.

The system may further include a first measurement unit configured to receive the first signal and to count the number of rising edges and falling edges of the first signal.

The system may further include a second measurement unit configured to receive the second signal and to count the number of rising edges and falling edges of the second signal.

A difference in the delay time between the first logic gate and the second logic gate may be less than the delay time of each of the first logic gate and the second logic gate.

According to another aspect of the invention, a system for measuring an access time of a memory includes a first delay unit configured to delay a clock signal by a first delay time and to output a first delayed clock signal, a second delay unit configured to delay the clock signal by a second delay time greater than the first delay time and to output a second delayed clock signal, a first memory, data being read from the first memory in response to the first delayed clock signal, a first detection data storage configured to store the data read from the first memory in response to the second delayed clock signal, and a controller configured to measure an access time of the first memory based on a comparison of the data in the first detection data storage and the data in the memory, the first delayed clock signal and the second delayed clock signal. The first delay unit includes a first delay adjuster configured to delay the clock signal and to adjust a delay time (e.g., of the clock signal delayed by the first delay adjuster) by a multiple of a first reference signal, a second delay adjuster configured to delay the clock signal delayed by the first delay adjuster, to adjust a delay time (e.g., of the first delayed clock signal) by a sum of a multiple of a second reference time and a multiple of a third reference time, and to output the first delayed clock signal, a first selector configured to select and output one of the clock signal and the first delayed clock signal, a first inverter configured to invert the first delayed clock signal, a second selector configured to select and output one of the clock signal and an output of the first inverter to the first delay adjuster, and a first AND gate configured to perform an AND operation on the output of the first inverter and a count enable signal and to output a first signal.

The second delay unit may include a third delay adjuster configured to delay the clock signal and to adjust the delay time (e.g., of the clock signal delayed by the third delay adjuster) by the multiple of the first reference time, a fourth delay adjuster configured to delay the clock signal delayed by the third delay adjuster, to adjust the delay time (e.g., of the second delayed clock signal) by the sum of the multiple of the second reference time and the multiple of the third reference time, and to output the second delayed clock signal, a third selector configured to select and output one of the clock signal and the second delayed clock signal, a second inverter configured to invert the second delayed clock signal, a fourth selector configured to select and output one of the clock signal and an output of the second inverter to the third delay adjuster, and a second AND gate configured to perform an AND operation on the output of the second inverter and a count enable signal and to output a second signal.

The system may further include a second memory, data being read from the second memory in response to the second delayed clock signal, and a second detection data storage configured to store the data read from the second memory in response to the first delayed clock signal.

Each of the first delay adjuster and the third delay adjuster may include first to n-th (n being a natural number greater than 1) first unit delay blocks, each of the first unit delay blocks may include an inverter and an inversion output multiplexer including a first input terminal, a second input terminal and an output terminal and configured to select one of a signal input to the first input terminal and a signal input to the second input terminal based on a first selection signal and to output a selected inverted signal. The output terminal of the inverter may be connected to the first input terminal of the inversion output multiplexer, and the output terminal of the inversion output multiplexer of a k-th (k being a natural number satisfying 1<k≤n) first unit delay block may be connected to the second input terminal of the inversion output multiplexer of a (k−1)-th (k being a natural number satisfying 1<k≤n) first unit delay block.

Each of the second delay adjuster and the fourth delay adjuster may include a plurality of second unit delay blocks connected in series. Each of the second unit delay blocks may include a buffer configured to buffer the clock signal delayed by the first delay adjuster, a third inverter configured to invert a second selection signal, a first logic gate configured to perform a logic operation on output of the buffer and output of the third inverter, a second logic gate configured to perform a logic operation on the output of the buffer and one of a plurality of second selection signals and a third logic gate configured to perform a logic operation on the output of the first logic gate and the output of the second logic gate. The first logic gate and the second logic gate may each comprise an AND gate, and outputs of the first and second logic gates may have different slew rates.

According to another aspect of the invention, a system for measuring an access time of a memory includes a first delay unit configured to delay a clock signal by a first delay time and to output a first delayed clock signal, a second delay unit configured to delay the clock signal by a second delay time greater than the first delay time and to output a second delayed clock signal, a memory configured to store data, the data being read from the memory in response to the first delayed clock signal, a detection data storage configured to store the data read from the memory in response to the second delayed clock signal and a controller configured to measure the access time of the memory based on a comparison of the data in the detection data storage and the data in the memory, the first delayed clock signal and the second delayed clock signal. Each of the first delay unit and the second delay unit includes first unit delay blocks configured to set a delay time based on a first selection signal and second unit delay blocks configured to set a delay time based on a second selection signal. Each of the first unit delay blocks has a delay time corresponding to a first reference signal, and each of the second unit delay blocks has a delay time corresponding to a second reference signal or a third reference signal. The first to third reference signals are different.

It is to be understood that both the foregoing general description and the following detailed description of the embodiments are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings:

FIG. 4 is a diagram showing an exemplary embodiment of a first delay adjuster shown in FIG. 3a;

FIG. 6 is a diagram showing an exemplary embodiment of a second delay adjuster shown in FIG. 3a;

DETAILED DESCRIPTION OF THE INVENTION

Figure 1:
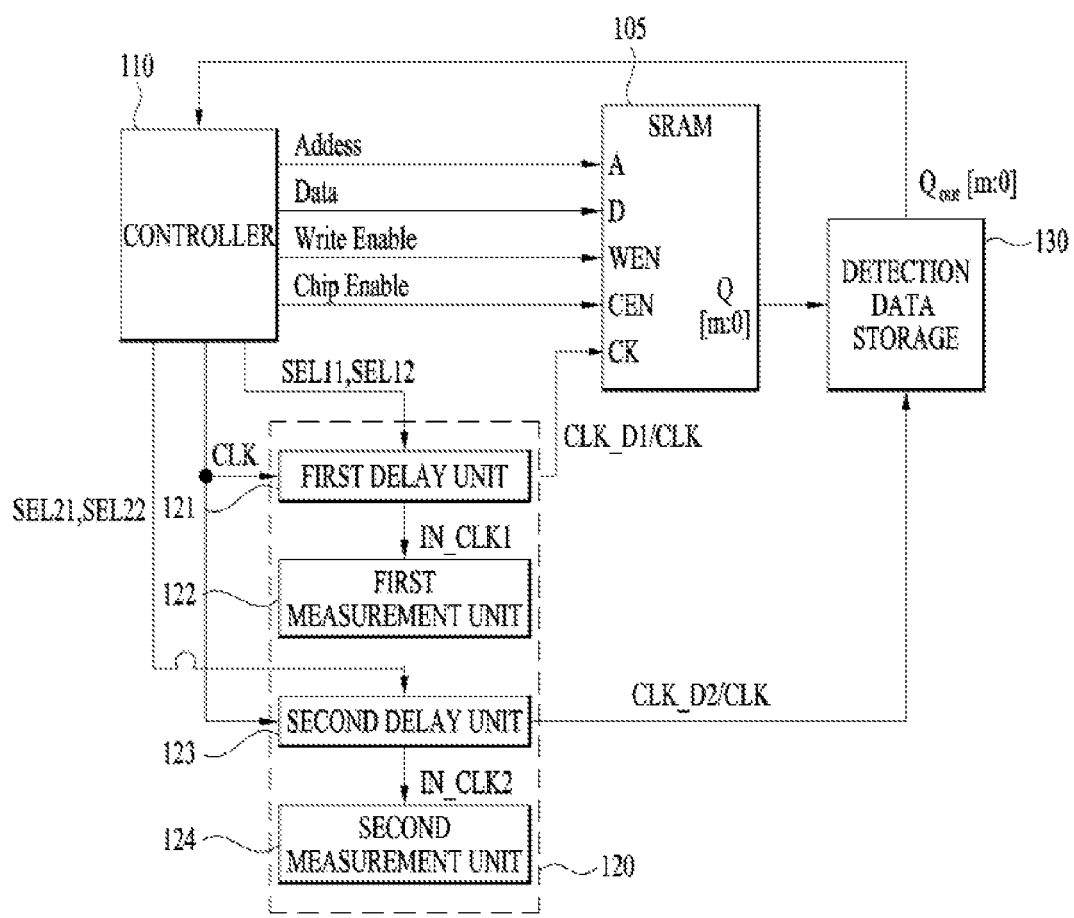
FIG. 1 is a diagram showing the configuration of an exemplary system for measuring an access time of an embedded SRAM according to one or more embodiments.

Hereinafter, embodiments of the invention will be more clearly appreciated through the accompanying drawings and the following description thereof.

In the description of various embodiments, it will be understood that, when an element such as a layer (film), region, pattern or structure is referred to as being "on" or "under" another element, such as a substrate, layer (film), region, pad or pattern, it can be directly "on" or "under" the other element or be indirectly "on" or "under" the other element with intervening elements therebetween. It will also be understood that "on" and "under" the element is described relative to the drawings.

In addition, the relative terms "first" and "second", "top/upper/above", "bottom/lower/under" and the like in the description and claims may be used to distinguish between one substance or element and other substances or elements, and not necessarily for describing any necessary or required physical or logical relationship between the substances or elements, or a particular order of the substances or elements. In addition, the same reference numerals designate the same constituent elements throughout the description of the drawings.

Figure 2:
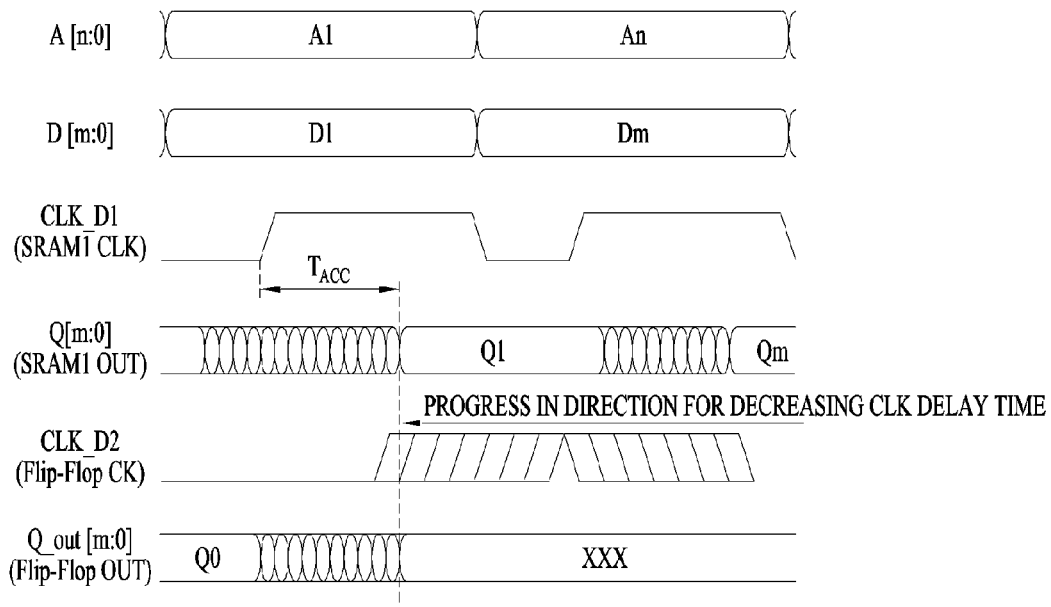
FIG. 2 is a timing diagram illustrating an exemplary measurement of the access time using the system of FIG. 1.

FIG. 1 is a diagram showing an exemplary configuration of a system 100 for measuring the access time of an embedded SRAM according to an embodiment of the present invention, and FIG. 2 is a timing diagram illustrating the measurement of the access time in the system of FIG. 1.

Referring to FIGS. 1 and 2, the system 100 for measuring the access time includes a controller 110, a delay block 120 and a detection data storage 130.

The controller 110 provides control signals for write and read operations, such as Address[n:0], Data[m:0], Write Enable and Chip Enable, to the memory. For example, the memory may be a static random access memory (SRAM) 105.

The controller 110 provides a clock signal CLK and first and second selection signals SEL11 and SEL12 to a first delay unit 121, and the clock signal CLK and third and fourth selection signals SEL21 and SEL22 to a second delay unit 123.

Figure 3A:
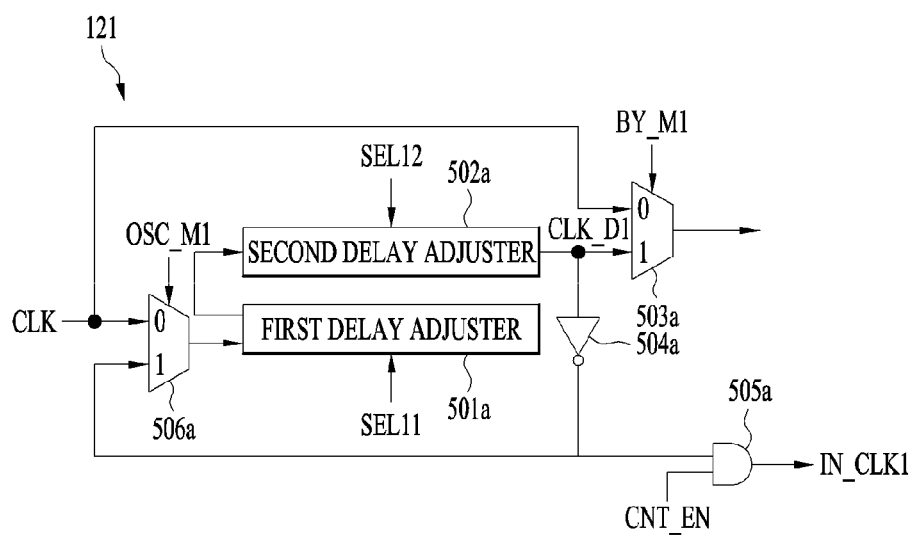
FIG. 3a is a diagram showing an exemplary embodiment of a first delay unit shown in FIG. 1.

In addition, as shown in FIG. 3A, the controller 110 provides a control signal BY_M1 to a selector 503a of the first delay unit 121 and a control signal OSC_M1 to a selector 506a.

Figure 3B:
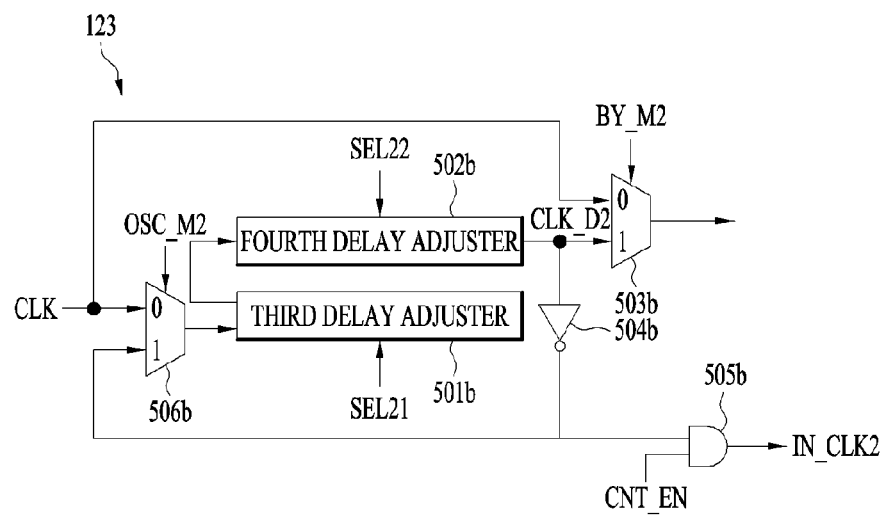
FIG. 3b is a diagram showing an exemplary embodiment of a second delay unit shown in FIG. 1.

As shown in FIG. 3B, the controller 110 also provides a control signal BY_M2 to a selector 503b of the second delay unit 123 and a control signal OSC_M2 to a selector 506b.

In addition, the controller 110 provides a reset signal RSTN (FIGS. 8-10) to first and second measurement units 122 and 124 and the detection data storage 130.

The delay block 120 includes a first delay unit 121 configured to set a first delay time based on the first selection signal SEL11 and the second selection signal SEL12, a first measurement unit 122 configured to measure the first delay time of the first delay unit 121, a second delay unit 123 configured to set a second delay time based on the fourth selection signal SEL21 and the fourth selection signal SEL22 and a second measurement unit 124 configured to measure the second delay time of the second delay unit 123.

The first delay unit 121 delays the clock signal CLK from the controller 110 by the first delay time, and outputs a first delayed clock signal CLK_D1.

For example, the first delayed clock signal CLK_D1 may be obtained by changing the phase (e.g., delaying a transition) of the clock signal CLK by the first delay time T1. The first delay time may be set based on the first and second selection signals SEL11 and SEL12 from the controller 110 to the first delay unit 121.

The SRAM 105 may store data based on (e.g., in response to) a write command (e.g. WEN) from the controller 110 and the clock signal CLK from the first delay unit 121.

Data stored in the SRAM 105 may be read in response to a read command from the controller 110 and the first delayed clock signal CLK_D1 from the first delay unit 121.

For example, the SRAM 105 may receive the first delayed clock signal CLK_D1 and read the data stored in the SRAM 105 in response to the received first delayed clock signal CLK_D1 (e.g., when the Chip Enable signal CEN is active and the Write Enable signal WEN is inactive).

In response to the second delayed clock signal CLK_D2, the detection data storage 130 stores the data read from the SRAM in response to the first delayed clock signal CLK_D1.

FIG. 3a is a diagram showing an exemplary embodiment of the first delay unit 121 shown in FIG. 1.

Referring to FIG. 3a, the first delay unit 121 includes a first delay adjuster 501a and a second delay adjuster 502a.

The first delay adjuster 501a adjusts the delay time of the first delay unit 121 by one or more units of a first reference time.

For example, the first delay adjuster 501a may adjust the delay time by a multiple of the first reference time.

The second delay adjuster 502a may adjust the delay time of the first delay unit 121 by a multiple of a second reference time, a multiple of a third reference time or a sum of a multiple of the second reference time and a multiple of the third reference time.

The second and third reference times are less than the first reference time and are different from each other.

For example, the first reference time may be greater than the delay time of the SRAM cell from a corresponding CMOS standard cell library, and each of the second reference time and the third reference time may be less than the delay time of the SRAM cell from the corresponding CMOS standard cell library.

The clock signal CLK may be delayed in a first process by the first delay adjuster 501a and may be delayed in a second process by the second delay adjuster 502a.

The first delay unit 121 may further include the first selector 503a.

The first delay unit 121 includes the first selector 503a, which may deliver the clock signal CLK to the SRAM 105 or the detection data storage 130 upon a function and/or test of the embedded memory (e.g., upon a write operation). In another embodiment, the first selector 503a may be omitted.

The first selector 503a is configured to output one of the clock signal CLK and the first delayed clock signal CLK_D1 from the second delay adjuster 502a to the memory (e.g., the SRAM 105o, based on the first control signal BY_M1. For example, when the first control signal BY_M1 has a first state (e.g., a "zero" in binary logic), the first selector 503a outputs the clock signal CLK, and when the first control signal BY_M1 has a second state (e.g., a "one" in binary logic), the first selector 503a outputs the first delayed clock signal CLK_D1.

In order to measure the delay times of the first and second delay adjusters 501a and 502a, the first delay unit 121 may further include a first inverter 504a, a second selector 506a and a first AND gate 505a.

By including the first inverter 504a, the second selector 506a and the first AND gate 505a, the first and second delay adjusters 501a and 502a, the first inverter 504a and the second selector 506a may function as a ring oscillator to generate a first signal IN_CLK1.

The first inverter 504a inverts the first delayed clock signal CLK_D1 from the second delay adjuster 502a.

The second selector 506a receives the clock signal CLK and the output of the first inverter 504a, and selects and outputs one of the clock signal CLK and the output of the first inverter 504a based on a control (e.g., oscillator select) signal OSC_M1. For example, when the control signal OSC_M1 has a first state (e.g., a "zero" in binary logic), the second selector 506a outputs the clock signal CLK, and when the control signal OSC_M1 has a second state (e.g., a "one" in binary logic), the second selector 506a outputs the output of the first inverter 504a.

The first AND gate 505a outputs the first signal IN_CLK1 based on a logical operation on the output of the first inverter 504a and a count enable signal CNT_EN. However, the invention is not limited to an AND gate to perform the logical operation of the first AND gate 505a. For example, the first AND gate 505a may be replaced with a NAND gate.

The count enable signal CNT_EN may be a signal configured to activate or initiate counting the number of cycles of the output of the inverter 504a.

Figure 4:
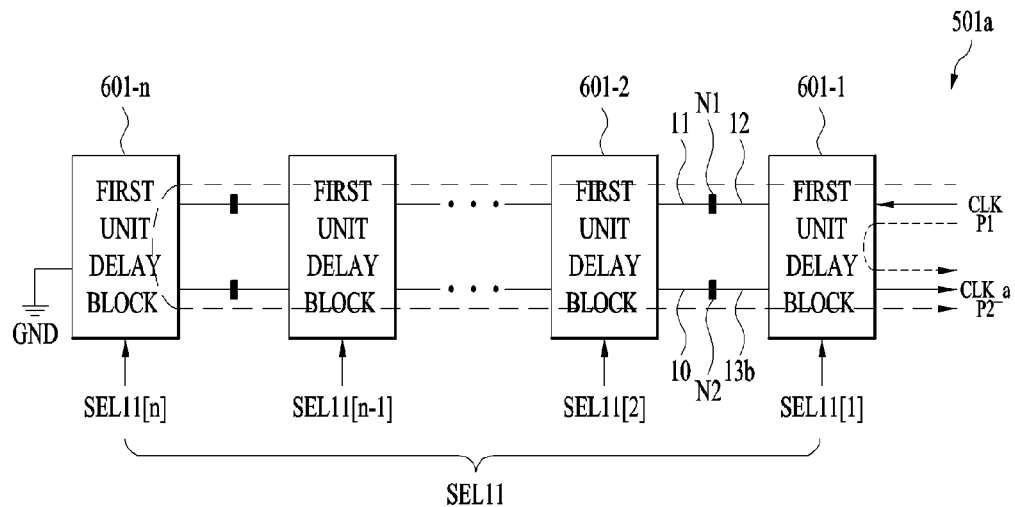

FIG. 4 is a diagram showing an exemplary embodiment of the first delay adjuster 501a shown in FIG. 3a.

Referring to FIG. 4, the first delay adjuster 501a includes a plurality of first unit delay blocks 601-1 to 601-$n$ ($n$ being a natural number greater than 1). For example, the first unit delay blocks 601-1 to 601-$n$ ($n$ being a natural number greater than 1) may be connected in series.

The delay time of each of the plurality of first unit delay blocks 601-1 to 601-$n$ ($n$ being a natural number greater than 1) may be the first reference time.

The first selection signal SEL11 may include a plurality of first selection control signals (or a single, multi-bit selection control signal) SEL11[1] to SEL11[$n$] corresponding to the first unit delay blocks 601-1 to 601-$n$ ($n$ being a natural number greater than 1).

Based on the first selection control signal(s) SEL11[1] to SEL11[$n$], the number and/or identity of the first unit delay blocks through which the clock signal will pass in order to delay the clock signal from the second selector 506a may be selected from among the first unit delay blocks 601-1 to 601-$n$ ($n$ being a natural number greater than 1).

For example, based on the first selection control signal(s) SEL11[1] to SEL11[$n$], the number of first unit delay blocks 601-1 to 601-$n$ through which the clock signal CLK (or the inverted first delayed clock signal) passes may be determined or selected.

When the first unit delay block 601-1 is selected, the clock signal CLK or the inverted first delayed clock signal may pass through the shortest delay path P1 (e.g., including only the first unit delay block 601-1), and thus, the first delay adjuster 501a may have the shortest delay time. In addition, when the first unit delay blocks 601-1 to 601-$n$ are all selected, the clock signal CLK may pass through the longest path P2 (e.g., including all of the first unit delay blocks 601-1 to 601-$n$), and thus, the first delay adjuster 501a may have the longest delay time. However, any number of sequential first unit delay blocks 601-1 to 601-$n$ may be selected, but the selected first unit delay blocks generally must start with first unit delay block 601-1 and select additional first unit delay blocks in sequence (e.g., first unit delay block 601-2, first unit delay block 601-3, etc.) in the embodiment shown in FIG. 4. As a result, the first selection control signal(s) SEL11[1] to SEL11[$n$] in the embodiment shown in FIG. 4 may have only the following allowed states: 00 . . . 00, 10 . . . 00, 11 . . . 00, . . . 11 . . . 10, and 111_1.

Figure 5:
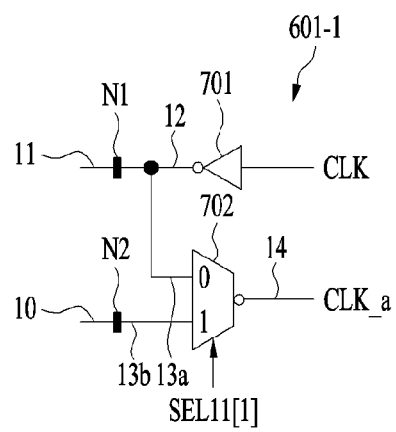
FIG. 5 is a diagram showing an exemplary embodiment of a first unit delay block shown in FIG. 4.

FIG. 5 is a diagram showing an embodiment of the first unit delay block 601-1 shown in FIG. 4.

Referring to FIG. 5, the first unit delay block 601-1 may include an inverter 701 and an inversion output multiplexer 702. The remaining first unit delay blocks 601-2 through 601-*n* may be identical to the first unit delay block 601-1.

The inverters respectively included in the first unit delay blocks 601-1 to 601-*n* may be connected in series.

The inversion output multiplexer 702 may include a first input terminal 13*a*, a second input terminal 13*b* and an output terminal 14. The inversion output multiplexer 702 may select one of the signals input to the first input terminal 13*a* and the second input terminal 13*b* based on the first selection control signal SEL11[1] to SEL11[*n*]. The inversion output multiplexer 702 may output the complement of the selected signal (e.g., an inverted selected signal).

The output terminal (e.g., 12) of the inverter 701 of each first unit delay block 601-1 to 601-*n* may be connected to the first input terminal 13*a* of the corresponding inversion output multiplexer 702.

In addition, the output terminal of the inversion output multiplexer 702 of a k-th (k being a natural number satisfying 1<k≤n) first unit delay block 601-*k* may be connected to the second input terminal 10 of the inversion output multiplexer of a (k−1)-th (k being a natural number satisfying 1<k≤n) first unit delay block 601-(*k*−1).

In another embodiment, the inversion output multiplexer 702 may be replaced with a non-inverting multiplexer.

For example, in FIGS. 4 and 5, node N1 may be a connection node between the output terminal 12 of the inverter 701 of the first unit delay block 601-1 and the input terminal 11 of the inverter of the first unit delay block 601-2. For example, node N2 may be a connection node between the output terminal 14 of the inversion output multiplexer 702 of the first unit delay block 601-2 and the second input terminal 13*b* of the inversion output multiplexer 702 of the first unit delay block 601-1.

For example, in the case of SEL11[1]=0, the first delay adjuster 501*a* may select the shortest path P1, and the delay time may be the shortest of the possible delay times. In addition, for example, in the case of SEL11[1]=1 . . . , SEL[*n*−1]=1 and SEL11[*n*]=1, the first delay adjuster 501*a* may select the longest path P2, and the delay time may be the longest of the possible delay times.

For example, each of the plurality of first unit delay blocks 601-1 to 601-*n* may have the same configuration as shown in FIG. 5.

Figure 6:
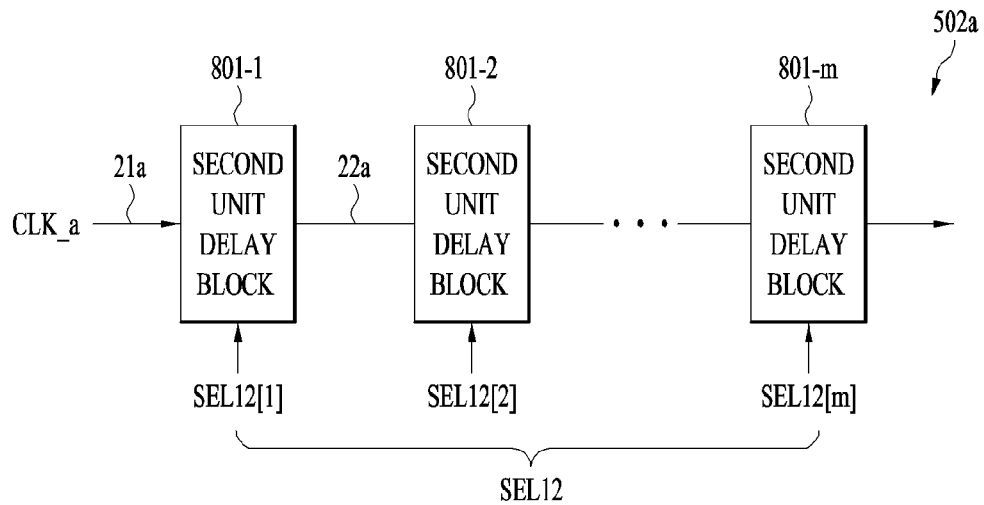

FIG. 6 is a diagram showing an embodiment of the second delay adjuster 502*a* shown in FIG. 3*a*.

Referring to FIG. 6, the second delay adjuster 502*a* may include a plurality of second unit delay blocks 801-1 to 801-*m* (m being a natural number greater than 1). The remaining second unit delay blocks 801-2 through 801-*m* may be identical to the second unit delay block 801-1. For example, the second unit delay blocks 801-1 to 801-*m* (m being a natural number greater than 1) may be connected in series.

The delay time of each of the plurality of second unit delay blocks 801-1 to 801-*m* (m being a natural number greater than 1) may be a second reference time or a third reference time.

The second selection signal SEL12 may include a plurality of second selection control signals (or a single, multi-bit selection control signal) SEL12[1] to SEl12[*m*] corresponding to the second unit delay blocks 801-1 to 801-*m* (m being a natural number greater than 1).

Based on the second selection control signals SEL12[1] to SEl12[*m*], each of the second unit delay blocks 801-1 to 801-*m* (m being a natural number greater than 1) may have the second reference time or the third reference time. The second reference time and the third reference time may be different from each other.

Figure 7:
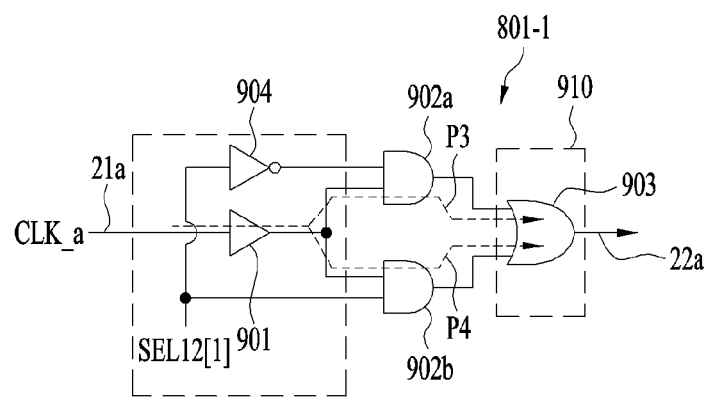
FIG. 7 is a diagram showing an exemplary embodiment of a second unit delay block shown in FIG. 6.

FIG. 7 is a diagram showing an embodiment of the second unit delay block 801-1 shown in FIG. 6.

Referring to FIG. 7, the second unit delay block 801-1 includes a first logic gate 902*a*, a second logic gate 902*b* and a path selector 910.

Each of the second unit delay blocks 801-1 to 801-*m* (m being a natural number greater than 1) may include an input terminal (e.g., 21*a*) and an output terminal 22*a*. The input terminal of a k-th (k being a natural number satisfying 1<k≤m) second unit delay block 801-*k* may be connected to the output terminal of a (k−1)-th (k being a natural number satisfying 1<k≤m) second unit delay block 801-(*k*−1).

A signal input to the input terminal 21*a* of the second unit delay block 801-1 is input to the first logic gate 902*a* and the second logic gate 902*b*.

The second unit delay block 801-1 may further include a buffer 901 configured to buffer a clock signal CLK_a (e.g., the clock signal CLK in FIG. 1) at the input terminal 21*a* and output the buffered clock signal CLK_a to the first logic gate 902*a* and the second logic gate 902*b*. The buffer 901 may serve to equalize the slew rates of the signals input to the first logic gate 902*a* and the second logic gate 902*b*.

The path selector 910 outputs one of the output of the first logic gate 902*a* and the output of the second logic gate 902*b* through the output terminal 22*a* based on the second selection control signal (e.g., SEL12[1]). For example, when the second control signal has a first state, the path selector 910 outputs the output of the first logic gate 902*a*, and when the second control signal has a second (e.g., complementary) state, the path selector 910 outputs the output of the second logic gate 902*b*.

The first logic gate 902*a* and the second logic gate 902*b* may have different drive strengths. For example, the output of the first logic gate 902*a* and the output of the second logic gate 902*b* may have different slew rates.

In addition, for example, the first logic gate 902*a* may have the second delay time, and the second logic gate 902*b* may have the third delay time. For example, the second delay time of the first logic gate 902*a* and the third delay time of the second logic gate 902*b* may be different from each other, without being limited thereto.

The first logic gate 902*a* may be implemented by a first AND gate, the second logic gate 902*b* may be implemented by a second AND gate, and the path selector 910 may include a third logic gate (e.g., an OR gate 903) and optionally an inverter (e.g., inverter 904). However, other combinations of logic gates providing substantially the same results as AND gates and an OR gate may be suitable for use in the present second unit delay blocks 801-1 through 801-*m*.

The inverter 904 may invert the second selection control signal SEL12[1] and output the inverted signal.

The first logic gate 902*a* performs a logic operation (e.g., an AND operation) on the output of the buffer 901 and the output of the inverter 904, and outputs the result of the logic operation.

The second logic gate 902*b* performs a logic operation (e.g., an AND operation) on the output of the buffer 901 and the second selection control signal SEL12[1], and outputs the result of the logic operation.

The OR gate 903 performs a logic operation (e.g., an OR operation) on the output of the first logic gate 902*a* and the output of the second logic gate 902*b*, and outputs the result of the logic operation through the output terminal 22*a* of the second unit delay block 801-1.

The delay times of the AND gates implemented as the first and second logic gates may be less than that of one first unit delay block, and a difference in the delay times between the first logic gate 902*a* and the second logic gate 902*b* may be less than the delay time of each of the first logic gate 902*a* and the second logic gate 902*b*.

Each of the second unit delay blocks 801-1 to 801-*m* (m being a natural number greater than 1) may select either of the first logic gate 902*a* and the second logic gate 902*b* having different delay times and/or slew rates based on the selection control signal (e.g., SEL12[1]) corresponding thereto. That is, each of the second unit delay blocks 801-1 to 801-*m* (m being a natural number greater than 1) may select either of the different delay paths P3 and P4 based on the selection control signal corresponding thereto.

For example, each of the second unit delay blocks 801-1 to 801-*m* may have the same configuration as shown in FIG. 7.

The second delay unit 123 delays the clock signal CLK from the controller 110 by the second delay time and outputs a second delayed clock signal CLK_D2.

For example, the second delayed clock signal CLK_D2 may be obtained by changing the phase (e.g., delaying a transition) of the clock signal CLK by the second delay time. The second delay time may be based on the first and second selection signals SEL21 and SEL22 from the controller 110 to the second delay unit 123.

FIG. 3*b* is a diagram showing an embodiment of the second delay unit 123 shown in FIG. 1.

Referring to FIG. 3*b*, the second delay unit 123 may include a third delay adjuster 501*b* and a fourth delay adjuster 502*b*.

The description of the first delay adjuster 501*a* of the first delay unit 121 shown in FIG. 3*a* is applicable to the third delay adjuster 501*b* of the second delay unit 123 shown in FIG. 3*b*.

The description of the second delay adjuster 502*a* of the first delay unit 121 shown in FIG. 3*a* is applicable to the fourth delay adjuster 502*b* of the second delay unit 123 shown in FIG. 3*b*.

The second delay unit 123 may further include a third selector 503*b* and output one of the clock signal CLK and the second delayed clock signal CLK_D2 from the second delay adjuster 502*b* based on a second control signal BY_M2. The description of the first selector 503*a* of FIG. 3*a* is applicable to the third selector 503*b* of FIG. 3*b*.

In addition, the second delay unit 123 may further include a second inverter 504*b*, a fourth selector 506*b* and a second AND gate 505*b*. The second inverter 504*b*, the fourth selector 506*b*, the first inverter 504*b* and the second selector 506*b* may function as a ring oscillator to generate a second signal INT_2, to which the description of the first inverter 504*a*, the second selector 506*a* and the first AND gate 505*a* of FIG. 3*a* is applicable.

The description of the first delay adjuster 501*a* and the first unit delay block of FIGS. 4 and 5 is applicable to the third delay adjuster 501*b* of FIG. 3*b*.

The description of the second delay adjuster 501*a* and the second unit delay block of FIGS. 6 and 7 is applicable to the fourth delay adjuster 502*b* of FIG. 3*b*.

The first measurement unit 122 counts the number of cycles of the first signal IN_CLK1 from the first AND gate 505*a* of the first delay block 121.

Figure 8:
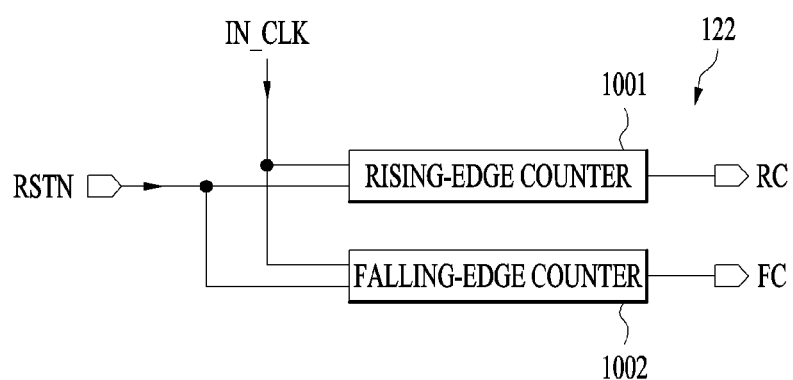
FIG. 8 is a diagram showing an exemplary embodiment of a first measurement unit shown in FIG. 1.

FIG. 8 is a diagram showing an embodiment of the first measurement unit 122 shown in FIG. 1.

Referring to FIG. 8, the first measurement unit 122 includes a rising-edge counter 1001 and a falling-edge counter 1002.

The rising-edge counter 1001 receives the first signal IN_CLK1 and counts the rising edges of the first signal IN_CLK1. For example, the rising-edge counter 1001 may include a first plurality of flip-flops.

The falling-edge counter 1002 receives the first signal IN_CLK1 and counts the falling edges of the first signal IN_CLK1. For example, the falling-edge counter 1002 may include a second plurality of flip-flops. The number of flip-flops included in each of the rising-edge counter and the falling-edge counter may be determined to sufficiently prevent overflow (e.g., during the counting operation).

The first signal IN_CLK1 may be simultaneously input to the rising-edge counter 1001 and the falling-edge counter 1002.

The rising-edge counter 1001 and the falling-edge counter 1002 may be reset in response to a reset signal RSTN.

In order to reduce the influence of a resistance component and a capacitive component (e.g., of the wires carrying the signal IN_CLK1), the rising-edge counter 1001 and the falling-edge counter 1002 may be located adjacent to the second delay adjuster 502*a* of the first delay unit 121.

The second measurement unit 124 counts the number of cycles of the second IN_CLK2 from the second AND gate 505*b* of the second delay block 123.

For example, the second measurement unit 124 may have the same structure as the first measurement unit 122 shown in FIG. 8, and the description of the first measurement unit 122 of FIG. 8 is applicable to the second measurement unit 124.

The detection data storage 130 stores the output of the memory (e.g., the SRAM 105) in response to the second delayed clock signal CLK_D2 from the second delay unit 123.

Figure 9:
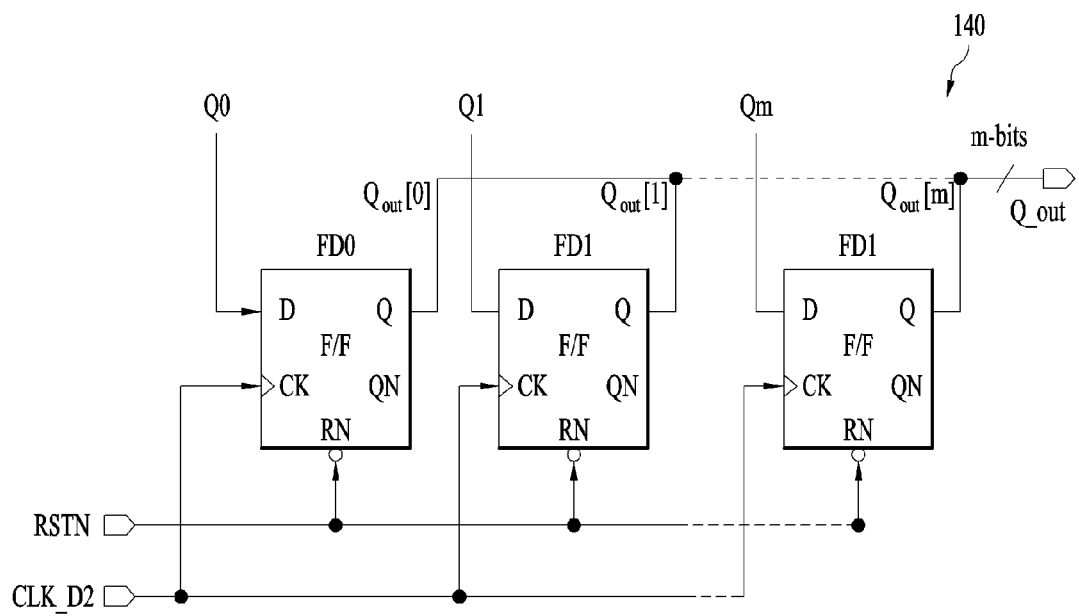
FIG. 9 is a diagram showing an exemplary embodiment of a detection data storage shown in FIG. 1.

FIG. 9 is a diagram showing an exemplary embodiment of the detection data storage 130 shown in FIG. 1.

Referring to FIG. 9, the detection data storage 130 includes at least one flip-flop configured to store the output of the SRAM 105 in response to the rising edge or the falling edge of the second delayed clock signal CLK_2.

For example, the detection data storage 130 may include a plurality of flip-flops (e.g., at least m flip-flops, where m is as defined herein) configured to store data Q0 to Qm stored in the SRAM 105 in response to the second delayed clock signal CLK_D2. The flip-flops may be reset in response to the reset signal RSTN.

Next, a method of measuring the access time of the memory (e.g., the SRAM 105) using the system 100 shown in FIG. 1 will be described.

First, the first delay time of the first delayed clock signal CLK_D1 and the second delay time of the second delayed clock signal CLK_D2 are measured. A lookup table may store the first and second delay times.

Figure 11:
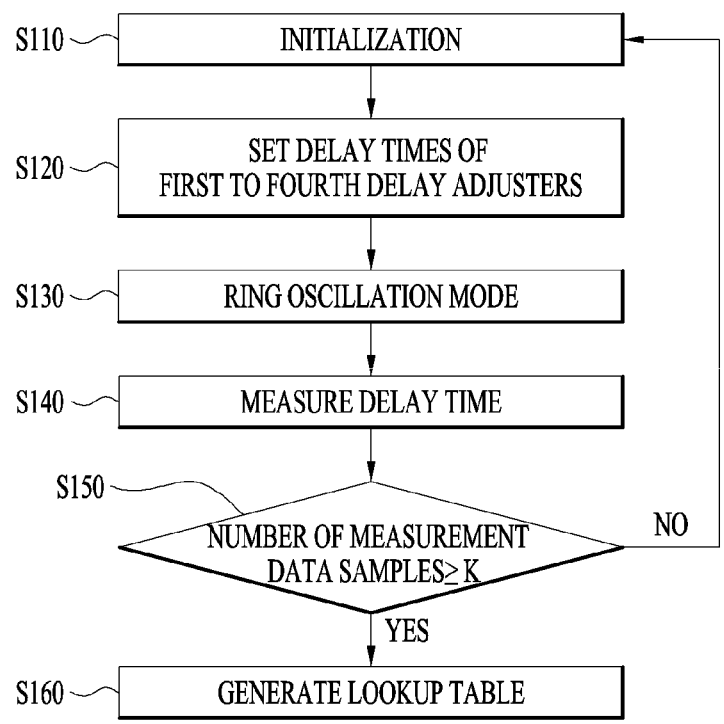
FIG. 11 is a flowchart illustrating an exemplary method of measuring first and second delay times.

FIG. 11 is a flowchart illustrating a method of measuring first and second delay times.

Referring to FIG. 11, the first measurement unit 122, the second measurement unit 124 and the detection data storage 130 are initialized (S110). For example, the rising-edge counter 1001 and the falling-edge counter 1002 shown in FIG. 8 and the plurality of flip-flops FD0 to FDm shown in FIG. 9 are reset (e.g., by asserting the reset signal RSTN in an active state).

Next, the delay time of the first delay adjuster 501a and the delay time of the second delay adjuster 502a of the first delay unit 121 are set, and the delay time of the third delay adjuster 501b and the delay time of the fourth delay adjuster 502b of the second delay unit 123 are set (S120).

For example, the delay time of the first delay adjuster 501a may be set based on the first selection signal SEL11, and the delay time of the second delay adjuster 502a may be set based on the second selection signal SEL12, thereby setting the first delay time of the first delay unit 121.

The delay time of the third delay adjuster 501b may be set based on the third selection signal SEL21, and the delay time of the fourth delay adjuster 502b may be set based on the fourth selection signal SEL22, thereby setting the second delay time of the second delay unit 122.

Next, the first delay unit 121 and the second delay unit 123 are placed in or switched to a ring oscillation mode (S130).

First, the clock signal CLK may be input to the first and third delay adjusters 501a and 501b by setting the state of the control signal OSC_M1 to the second and fourth selectors 506a and 506b to one that selects the clock signal CLK (e.g., The first selector 503a outputs the clock signal CLK to the SRAM 105 by setting the first (e.g., bypass) control signal BY_M1 to a state that selects the clock signal CLK (e.g., "0"). The third selector 503b outputs the clock signal CLK to the detection data storage 130 by setting the second control signal BY_M2 to a state that selects the clock signal CLK (e.g., "0"). To this end, the clock signal CLK is delivered to the detection data storage 130 and the SRAM 105 to prevent the detection data storage 130 from performing operations such as read, write or storage operations, but enabling the SRAM 105 to perform operations such as read, write and/or storage operations.

The first and second delay adjusters 501a and 502a then operate on (e.g., delay) the clock signal CLK to generate the first delayed clock signal CLK_D1, and the first inverter 504a inverts the first delayed clock signal CLK_D1. In addition, the third and fourth delay adjusters 501b and 502b also operate on (e.g., delay) the clock signal CLK to generate the second delayed clock signal CLK_D2, and the second inverter 504b inverts the second delayed clock signal CLK_D2. The second selector 506a of the first delay unit 121 selects and outputs the output of the first inverter 504a when the control signal OSC_M1 changes state (e.g., to "1") to select the inverted first delayed clock signal, and the fourth selector 506b of the second delay unit 123 selects and outputs the output of the second inverter 504b when the control signal OSC_M2 changes state (e.g., to "1") to select the inverted second delayed clock signal.

To this end, the first and second delay adjusters 501a and 502a and the first inverter 504a function as a first ring oscillator and generate a clock having a predetermined period. In addition, the third and fourth delay adjusters 501b and 502b and the second inverter 504b may function as a second ring oscillator and generate a clock having a predetermined period.

When the count enable signal CNT_EN is activated, the first and second delay units 121 and 123 generate and/or output first and second clocks IN_CLK1 and IN_CLK2.

For example, the first AND gate 505a may receive the count enable signal CNT_EN having a high binary logic level (e.g., "1") and the output of the first inverter 504a, and generate the first clock IN_CLK1 having a predetermined period.

In addition, the second AND gate 505b may receive the count enable signal CNT_EN having a high binary logic level (e.g., "1") and the output of the second inverter 504b, and generate the second clock IN_CLK2 having a different predetermined period.

Next, the delay time of the first delay unit 121 is measured by the first measurement unit 122, and the delay time of the second delay unit 123 is measured by the second measurement unit 124 (S140).

The first measurement unit 122 receives the first clock IN_CLK1 and counts the number of rising and falling edges of the received first clock IN_CLK, and the second measurement unit 124 receives the second clock IN_CLK2 and counts the number of rising and falling edges of the received second clock IN_CLK2.

After the rising-edge counter 1001 and the falling-edge counter 1002 of each of the first and second measurement units 122 and 124 count edges or transitions of the respective clocks IN_CLK1 and IN_CLK2 for a sufficient length of time and/or number of cycles, the count enable signal CNT_EN is set to a low level (e.g., a binary logic "0") to stop the counting operation.

Final data values stored in the rising-edge counter 1001 and the falling-edge counter 1002 after stopping the counting operation are stored and read (e.g., when needed for a successive step or operation).

Next, the method determines whether the number of acquired measurement data samples is equal to or greater than a predetermined value K (S150). For example, the threshold K may be selected in order to ensure that sufficient data values and/or a sufficient number of data values are obtained.

If the number of acquired measurement data samples is less than the predetermined value K, steps S110 to S140 are performed (e.g., continuously). To this end, it is possible to acquire data regarding the number of rising and falling edges of the first clock IN_CLK corresponding to the set first and second selection signals SEL11 and SEL12 and data regarding the number of rising and falling edges of the second clock IN_CLK2 corresponding to the set third and fourth selection signals SEL21 and SEL 22.

Steps S110 to S150 may be repeatedly performed with different values of the first to fourth selection signals SEL11 to SEL22.

For example, if each of the first selection signal SEL11 and the second selection signal SEL12 has n bits, steps S110 to S140 may be performed 2×2n times to acquire data for 4n possible combinations of the first and second selection signals SEL11 and SEL12. Thus, K may be 4n, in one example.

Alternatively, for example, selection control signals to be used may be sampled through post-layout simulation, and steps S110 to S150 may be repeatedly performed for the number of sampled selection control signals to thereby acquire data for a plurality of different combinations of the first and second selection signals SEL11 and SEL12. Thus, in other examples, K may be x*n, where x is the number of different combinations of values of the first and second selection signals SEL11 and SEL12.

If the number of acquired measurement data samples is greater than or equal to the predetermined value K, a lookup table is generated, and the acquired data is stored in the lookup table (S160).

The lookup table may be used to calculate (1) the delay time according to the first and second selection signals tested and (2) the delay time according to the third and fourth selection signals tested. The access time can be determined from the delay times.

For example, a first delay time from the clock signal CLK to the first delayed clock signal CLK_D1 received at the SRAM 105 may be calculated using the final counting values RC and FC (see FIG. 8) in the rising-edge counter 1001 and the falling-edge counter 1002 of the first measurement unit 122.

In addition, for example, a second delay time from the clock signal CLK to the second delayed clock signal CLK_D2 received at the detection data storage 130 may be calculated using the final counting values RC and FC (see FIG. 8) in the rising-edge counter 1001 and the falling-edge counter 1002 of the second measurement unit 124.

Equations 1 and 2 below may be executed by the first measurement unit 122 to calculate the first delay time and may be applied to the second measurement unit 124 to calculate the second delay time.

$$DT = \frac{EnT}{\left(\frac{R_{loop}}{2}\right)} \quad \text{Equation 1}$$

DT denotes the first delay time (or the second delay time).

EnT may be the length of time that the count enable signal CNT_EN input to the first delay unit 121 (or the second delay unit 122) is activated. This length of time may be, for example, obtained by multiplying (i) the number of cycles of the clock signal CLK during which the count enable signal CNT_EN is active (e.g., has a binary logic "1" level) by the period of the clock signal CLK.

Rloop may be obtained as shown in Equation 2.

$$R_{loop} = FTR + RTR \quad \text{Equation 2}$$

FTR may be an average value of (e.g., average number of transitions counted by) the falling-edge counter 1002 (e.g., over the K or more acquired measurement data samples), and RTR may be an average value (e.g., average number of transitions counted by) of the rising-edge counter 1001 (e.g., over the K or more acquired measurement data samples).

Next, the access time of the memory is measured.

Figure 12:
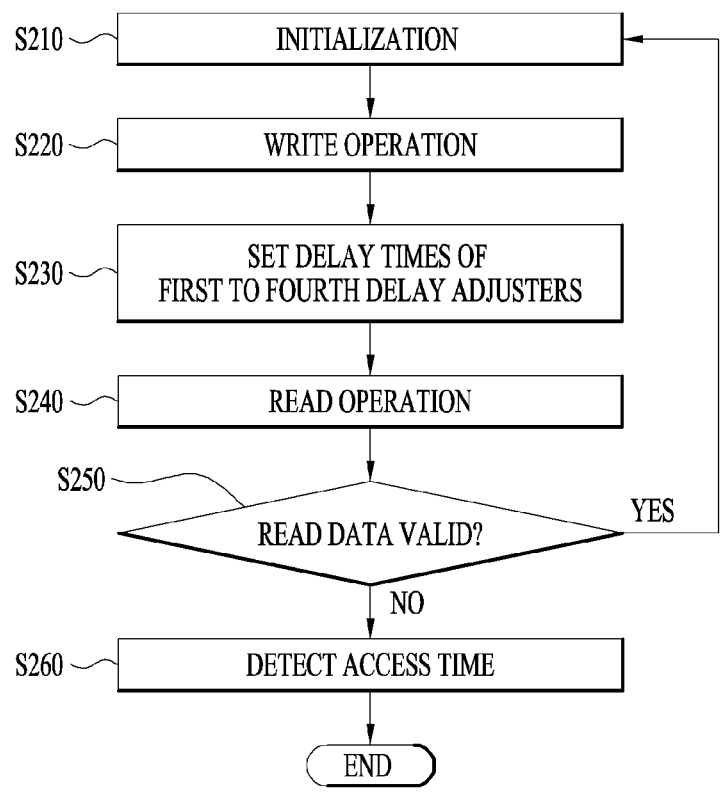
FIG. 12 is a flowchart illustrating an exemplary measurement of a memory access time.

FIG. 12 is a flowchart illustrating the measurement of the memory access time.

Referring to FIG. 12, the first measurement unit 122, the second measurement unit 124 and the first detection data storage 130 are initialized (S210).

For example, the flip-flops of the first and second measurement units 122 and 124 and the first detection data storage 130 may be initialized to "0" by asserting or activating a reset signal (e.g., RSTN="0").

By setting the control signal OSC_M1 to select the clock signal CLK (e.g., setting the control signal OSC_M1 to "0") and/or deactivating the count enable signal (e.g., CNT_EN="0"), the rising-edge counter 1001 and the falling-edge counter 1002 of the first and second measurement units 122 and 124 may not operate.

When the control signals OSC_M1 and OSC_M2="0", the ring oscillation mode of each of the first and second delay units 121 and 123 is released (e.g., inactive), although the invention is not limited to this implementation.

When the first and second control signals BY_M1="0" and BY_M2="0", the first and third selectors 503a and 503b select and output the clock signal CLK. To this end, the clock signal CLK may be provided to the SRAM 105 and the clock signal CLK may be provided to the detection data storage 130.

Next, a write operation is performed in the SRAM 105 (S220).

When the write command is provided from the controller 110 to the SRAM 105, data may be written at a predetermined address of the SRAM 105.

For example, the write command may include an address of the memory 105 (e.g., Address), the data to be written into the memory 105 (e.g., Data), an enabled chip enable signal Chip Enable, an enabled write enable signal Write Enable. The data is written into the memory 105 upon an active level or edge of the clock signal CLK (e.g., a high logic level or a rising transition).

For example, Address, Data, the enabled chip enable signal Chip Enable and the enabled write enable signal Write Enable may be provided from the controller 110 to the SRAM 105, and the clock signal CLK may be provided from the controller 110 to the first and second delay units 121 and 123.

When the chip enable signal Chip Enable and/or the write enable signal Write Enable is disabled, the write operation is complete.

The write operation is repeatedly performed at predetermined addresses of the SRAM. The write operation may be performed such that a write pattern becomes a physical "chess board" (e.g., one row has a pattern 10 . . . 10, and the adjacent row[s] have a complementary pattern 01 . . . 01).

Next, the first delay time and the second delay time are set (S230).

The first delay time of the first delay unit 121 is set by the first and second selection signals SEL11 and SEL12, and the second delay time of the second delay unit 123 is set by the third and fourth selection signals SEL21 and SEL22.

For example, the first delay adjuster 501a and the second adjuster 502b may be set by the first and second selection signals SEL11 and SEL12. In one example, an initial setting of the first delay time is the shortest delay time.

The third delay adjuster 501b and the fourth delay adjuster 502b may be set by the third and fourth selection signals SEL21 and SEL22. In one example, an initial setting of the second delay time is the longest delay time.

Based on the first control signal BY_M1, the output of the first selector 503a becomes the first delayed clock signal CLK_D1, and the first delayed clock signal CLK_D1 is input to the SRAM 105.

Based on the second control signal BY_M2, the output of the third selector 503b becomes the second delayed clock signal CLK_D2, and the second delayed clock signal CLK_D2 is input to the detection data storage 130.

Next, the data in the address of the SRAM 105 is read in response to a read command, and the first delayed clock signal CLK_D1 and the data in the address of the SRAM 105 is received and stored in the detection data storage 130 in response to the second delayed clock signal CLK_D2 (S240).

The read command may include the address to be read and the enabled chip enable signal Chip Enable. The data is read from the memory 105 and stored in the detection data storage 130 upon an active level or edge of the first delayed clock signal CLK_D1 (e.g., a high logic level or "1").

Next, the controller 110 determines whether the data in the detection data storage 130 is received and/or is valid (S250).

For example, the controller 110 may determine whether the data in the detection data storage 130 is equal to valid data. For example, the valid data may be the data provided to the SRAM 105 in step S220 of performing the write operation.

When the data in the detection data storage 130 is valid, steps S230 to S250 may be repeatedly performed (S230 to S250).

For example, if the data in the detection data storage 130 is equal to the valid data, the third and fourth selection signals SEL21 and SEL22 may be adjusted such that the third delay adjuster 501b and the fourth adjuster 502b of the second delay unit 123 decrease the second delay time (S230), and the above-described read operation S240 may be performed again. The first and second selection signals SEL11 and SEL12 may not be changed. That is, the first and second selection signals SEL11 and SEL12 may continue to provide the shortest delay time.

The read operation S240 and the verification operation S250 may be complete when the chip enable signal CEN is deasserted or inactivated. Optionally or additionally, the read operation S240 and the verification operation S250 may be complete upon the next occurrence of the complementary level (e.g., a low logic level or "0") or transition of the clock signal CLK or of the first delayed clock signal CLK_D1.

As shown in FIG. 2, while gradually decreasing the delay time of the second delayed clock CLK_D2 of the second delay unit 123, the controller 110 may continue to determine whether the data in the detection data storage 130 is equal to valid data.

Steps S230 to S250 are repeatedly performed with respect to other addresses of the SRAM 105.

For example, for verification of the data value, valid data in the SRAM 105 is inverted whenever the address is changed (e.g., to an adjacent row).

When the data transmitted from the detection data storage 130 to the controller 110 is no longer valid, the access time of the memory is detected (S260).

Using the lookup table (e.g., step S160 of FIG. 11), when the data is no longer valid, the second delay time of the second delayed clock signal CLK_D2 corresponding to the third selection signal SEL21 of the third delay adjuster 501b and the fourth selection signal SEL22 of the fourth delay adjuster 502b may be determined or acquired.

Using the lookup table, when the data is no longer valid, the first delay time of the first delayed clock signal CLK_D1 corresponding to the first selection signal SEL11 of the first delay adjuster 501a and the second selection signal SEL12 of the second delay adjuster 502a may be determined or acquired.

A value obtained by subtracting the determined or acquired first delay time of the first delayed clock signal CLK_D1 from the determined or acquired second delay time of the second delayed clock signal CLK_D2 may be the access time of the RAM 105.

In embodiments of the system described herein, since the circuit is capable of performing built-in testing, it is possible to easily and rapidly eliminate human error as well as errors generated in or by a test device, and to measure the access time of the memory device at low cost.

In addition, in the embodiments described with reference to FIGS. 4 to 7, since the delay time can be changed to various values, and the unit reference value(s) can be changed to various values, it is possible to accurately measure the access time of the embedded memory.

Figure 10:
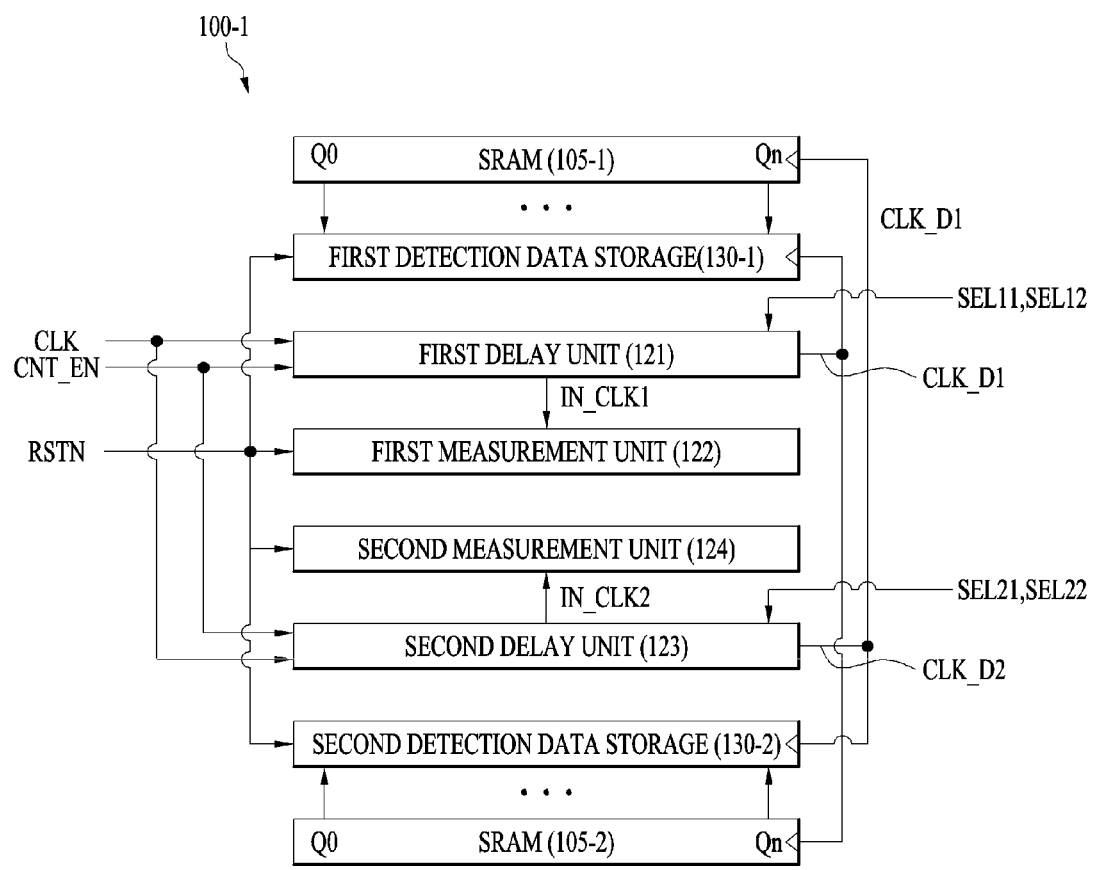
FIG. 10 is a diagram showing the configuration of an exemplary system for measuring an access time of an embedded SRAM according to one or more other embodiments.

FIG. 10 is a diagram showing the configuration of another exemplary system 100-1 configured to measure the access time of an embedded SRAM according to another embodiment.

Referring to FIG. 10, the system 100-1 configured to measure the access time of an embedded SRAM includes a first delay unit 121, a second delay unit 122, a first measurement unit 123, a second measurement unit 124, a first detection data storage 130-1, a second detection data storage 130-2, and a controller (not shown). The description of the controller 110 of FIG. 1 is applicable to the system 100-1, although the controller is not shown in FIG. 10. The descriptions of the first delay unit 121, the second delay unit 122, the first measurement unit 123, and the second measurement unit 124 of FIG. 1 are applicable to the system 100-1, and the description of the detection data storage 130 of FIG. 1 is applicable to the first detection data storage 130-1 and the second detection data storage 130-2. The system 100-1 may determine the access times of a first memory 105-1 and/or a second memory 105-2.

In FIG. 10, the access times of a pair of memories (e.g., SRAMs 105-1 and 105-2), are measured using the first delay unit 121, the second delay unit 122, the first measurement unit 123 and the second measurement unit 124, in order to compensate for (e.g., equalize) output capacitances and the fan out of the delay block, and accurately measure the access times of the embedded SRAM(s) and the flip-flops.

According to embodiments of the system 100-1, it is possible to easily, rapidly and accurately measure the access time of a memory while eliminating human error and errors generated in a test device.

Features, structures, effects, and the like as described above in the embodiments are included in at least one embodiment of the present invention and should not be limited to only one embodiment. In addition, the features, structures, effects, and the like described in the respective embodiments may be combined or modified even with respect to the other embodiments by those skilled in the art. Accordingly, contents related to these combinations and modifications should be construed as within the scope of the present invention.

What is claimed is:

1. A system for measuring an access time of a memory, the system comprising:
   a first delay unit configured to delay a clock signal by a first delay time and to output a first delayed clock signal;
   a second delay unit configured to delay the clock signal by a second delay time greater than the first delay time and to output a second delayed clock signal;
   a memory configured to store data, the data being read from the memory in response to the first delayed clock signal;
   a detection data storage configured to store the data from the memory in response to the second delayed clock signal; and
   a controller configured to measure an access time of the memory based on a comparison of the data in the detection data storage and the data in the memory, the first delayed clock signal and the second delayed clock signal.

2. The system according to claim 1, wherein the controller adjusts the second delay time of the second delay unit when the data in the detection data storage and the data in the memory are equal.

3. The system according to claim 2, wherein the controller detects a difference between the adjusted second delay time and the first delay time as the access time of the memory when the data in the detection data storage and the data in the memory are not equal.

4. The system according to claim 1, wherein:
the first delay unit includes:
a first delay adjuster configured to delay the clock signal; and
a second delay adjuster configured to delay the clock signal delayed by the first delay adjuster and to output the first delayed clock signal,
the first delay adjuster adjusts a delay time by a multiple of a first reference time, and
the second delay adjuster adjusts the delay time by a sum of a multiple of a second reference time and a multiple of a third reference time.

5. The system according to claim 4, wherein:
the second delay unit includes:
a third delay adjuster configured to delay the clock signal; and
a fourth delay adjuster configured to delay the clock signal delayed by the third delay adjuster and to output the second delayed clock signal,
the third delay adjuster adjusts the delay time by the multiple of the first reference time, and
the fourth delay adjuster adjusts the delay time by the sum of the multiple of the second reference time and the multiple of the third reference time.

6. The system according to claim 5, wherein:
each of the first delay adjuster and the third delay adjuster includes first to n-th (n being a natural number greater than 1) first unit delay blocks,
each of the second delay adjuster and the fourth delay adjuster includes a plurality of second unit delay blocks connected in series,
the delay time of each of the first unit delay blocks is the first reference time, and
the delay time of each of the second unit delay blocks is the second reference time or the third reference time.

7. The system according to claim 6, wherein:
each of the first unit delay blocks includes:
an inverter; and
an inversion output multiplexer including a first input terminal, a second input terminal and an output terminal and configured to select one of a signal input to the first input terminal and a signal input to the second input terminal based on a first selection signal and to output an inverted selected signal,
the output terminal of the inverter is connected to the first input terminal of the inversion output multiplexer, and
the output terminal of the inversion output multiplexer of a k-th (k being a natural number satisfying 1<k≤n) first unit delay block is connected to the second input terminal of the inversion output multiplexer of a (k−1)-th (k being a natural number satisfying 1<k≤n) first unit delay block.

8. The system according to claim 6, wherein:
each of the second unit delay blocks includes:
a first logic gate configured to perform a logic operation on the clock signal delayed by the first delay adjuster and a selection control signal;
a second logic gate configured to perform a logic operation on the clock signal delayed by the first delay adjuster and an inverted selection control signal; and
a path selector configured to output one of the output of the first logic gate and the output of the second logic gate based on a second selection signal, and
the first logic gate and the second logic gate have different slew rates.

9. The system according to claim 6, wherein:
each of the second unit delay blocks includes:
a buffer configured to buffer the clock signal delayed by the first delay adjuster;
a third inverter configured to invert a corresponding second selection signal;
a first logic gate configured to perform a logic operation on output of the buffer and output of the third inverter;
a second logic gate configured to perform a logic operation on the output of the buffer and the corresponding second selection signal; and
a third logic gate configured to perform a logic operation on the output of the first logic gate and the output of the second logic gate, and
the output of the first logic gate and the output of the second logic gate have different slew rates.

10. The system according to claim 9, wherein a difference in delay times of the first logic gate and the second logic gate is less than the delay time of each of the first logic gate and the second logic gate.

11. The system according to claim 5, wherein the first delay unit includes:
a first selector configured to select and output one of the clock signal and the first delayed clock signal;
a first inverter configured to invert the first delayed clock signal;
a second selector configured to select and output one of the clock signal and the output of the first inverter to the first delay adjuster; and
a first AND gate configured to perform an AND operation on the output of the first inverter and a count enable signal and to output a first signal.

12. The system according to claim 11, further comprising a first measurement unit configured to receive the first signal and to count a number of rising edges and falling edges of the first signal.

13. The system according to claim 5, wherein the second delay unit includes:
a third selector configured to select and output one of the clock signal and the second delayed clock signal;
a second inverter configured to invert the second delayed clock signal;
a fourth selector configured to select and output one of the clock signal and the output of the second inverter to the third delay adjuster; and
a second AND gate configured to perform an AND operation on the output of the second inverter and a count enable signal and to output a second signal.

14. The system according to claim 13, further comprising a second measurement unit configured to receive the second signal and to count a number of rising edges and falling edges of the second signal.

15. A system for measuring an access time of a memory, the system comprising:
a first delay unit configured to delay a clock signal by a first delay time and to output a first delayed clock signal;
a second delay unit configured to delay the clock signal by a second delay time greater than the first delay time and to output a second delayed clock signal;

a first memory, wherein data is read from the first memory in response to the first delayed clock signal;
a first detection data storage configured to store the data from the first memory in response to the second delayed clock signal; and
a controller configured to measure an access time of the first memory based on a comparison of the data in the detection data storage and the data in the memory, the first delayed clock signal and the second delayed clock signal,
wherein the first delay unit includes:
a first delay adjuster configured to delay the clock signal and to adjust a delay time of the clock signal by a multiple of a first reference signal;
a second delay adjuster configured to delay the clock signal delayed by the first delay adjuster, to adjust a delay time of the clock signal delayed by the first delay adjuster by a sum of a multiple of a second reference time and a multiple of a third reference time, and to output the first delayed clock signal;
a first selector configured to select and output one of the clock signal and the first delayed clock signal;
a first inverter configured to invert the first delayed clock signal;
a second selector configured to select and output one of the clock signal and the output of the first inverter to the first delay adjuster; and
a first logic gate configured to perform a logic operation on the output of the first inverter and a count enable signal and to output a first signal.

16. The system according to claim 15, wherein the second delay unit includes:
a third delay adjuster configured to delay the clock signal and to adjust the delay time of the clock signal by the multiple of the first reference time;
a fourth delay adjuster configured to delay the clock signal delayed by the third delay adjuster, to adjust the delay time of the clock signal delayed by the third delay adjuster by the sum of the multiple of the second reference time and the multiple of the third reference time and to output the second delayed clock signal;
a third selector configured to select and output one of the clock signal and the second delayed clock signal;
a second inverter configured to invert the second delayed clock signal;
a fourth selector configured to select and output one of the clock signal and output of the second inverter to the third delay adjuster; and
a second logic gate configured to perform a logic operation on the output of the second inverter and a count enable signal and to output a second signal.

17. The system according to claim 16, wherein:
each of the first delay adjuster and the third delay adjuster includes first to n-th (n being a natural number greater than 1) first unit delay blocks,
each of the first unit delay blocks includes:
an inverter; and
an inversion output multiplexer including a first input terminal, a second input terminal and an output terminal and configured to select one of a signal input to the first input terminal and a signal input to the second input terminal based on a first selection signal and to output an inverted selected signal,
the output terminal of the inverter is connected to the first input terminal of the inversion output multiplexer, and the output terminal of the inversion output multiplexer of a k-th (k being a natural number satisfying 1<k≤n) first unit delay block is connected to the second input terminal of the inversion output multiplexer of a (k−1)-th (k being a natural number satisfying 1<k≤n) first unit delay block.

18. The system according to claim 16, wherein:
each of the second delay adjuster and the fourth delay adjuster includes a plurality of second unit delay blocks connected in series;
each of the second unit delay blocks includes:
a buffer configured to buffer the clock signal delayed by the first delay adjuster;
a third inverter configured to invert a corresponding second selection signal;
a first logic gate configured to perform a logic operation on output of the buffer and output of the third inverter;
a second logic gate configured to perform a logic operation on the output of the buffer and the corresponding second selection signal; and
a third logic gate configured to perform a logic operation on the output of the first logic gate and the output of the second logic gate, and
the output of the first logic gate and the output of the second logic gate have different slew rates.

19. The system according to claim 15, further comprising:
a second memory, wherein data is read from the second memory in response to the second delayed clock signal; and
a second detection data storage configured to store the data from the second memory in response to the first delayed clock signal.

20. A system for measuring an access time of a memory, the system comprising:
a first delay unit configured to delay a clock signal by a first delay time and to output a first delayed clock signal;
a second delay unit configured to delay the clock signal by a second delay time greater than the first delay time and to output a second delayed clock signal;
a memory configured to store data, the data being read from the memory in response to the first delayed clock signal;
a detection data storage configured to store the data from the memory in response to the second delayed clock signal; and
a controller configured to measure an access time of the memory based on a comparison of the data in the detection data storage and the data in the memory, the first delayed clock signal and the second delayed clock signal, wherein:
each of the first delay unit and the second delay unit includes first unit delay blocks configured to set a delay time based on a first selection signal and second unit delay blocks configured to set a delay time based on a second selection signal,
each of the first unit delay blocks has a delay time corresponding to a first reference signal, and
each of the second unit delay blocks has a delay time corresponding to a second reference signal or a third reference signal, and the first to third reference signals are different.

* * * * *